(12) United States Patent
Inoue et al.

(10) Patent No.: US 12,543,247 B2
(45) Date of Patent: Feb. 3, 2026

(54) MEMBER FOR SEMICONDUCTOR MANUFACTURING APPARATUS

(71) Applicant: NGK Insulators, Ltd., Nagoya (JP)

(72) Inventors: Seiya Inoue, Handa (JP); Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 981 days.

(21) Appl. No.: 17/657,138

(22) Filed: Mar. 30, 2022

(65) Prior Publication Data

US 2022/0400539 A1 Dec. 15, 2022

(30) Foreign Application Priority Data

Jun. 10, 2021 (JP) ................. 2021-097247

(51) Int. Cl.
    *H05B 3/28* (2006.01)
    *H01L 21/683* (2006.01)
    *H05B 3/06* (2006.01)
    *H05B 3/26* (2006.01)

(52) U.S. Cl.
    CPC ......... *H05B 3/283* (2013.01); *H01L 21/6833* (2013.01); *H05B 3/06* (2013.01); *H05B 3/262* (2013.01); *H05B 2203/01* (2013.01); *H05B 2203/017* (2013.01)

(58) Field of Classification Search
    CPC ......... H01L 21/67103; H01L 21/67109; H01L 21/67248; H01L 21/6831; H01L 21/6833; H01L 21/68735; H01L 21/68757; H05B 2203/01; H05B 2203/017; H05B 3/06; H05B 3/262; H05B 3/283
    See application file for complete search history.

(56) References Cited

U.S. PATENT DOCUMENTS

| | | | |
|---|---|---|---|
| 2007/0144442 A1* | 6/2007 | Migita | H01L 21/68757 118/728 |
| 2018/0269097 A1 | 9/2018 | Maeta et al. | |
| 2020/0243372 A1* | 7/2020 | Aoto | H01L 21/67098 |

FOREIGN PATENT DOCUMENTS

| | | |
|---|---|---|
| CN | 108028219 A | 5/2018 |
| JP | 2006-080389 A | 3/2006 |
| JP | 2007-194616 A | 8/2007 |
| JP | 2016-207979 A | 12/2016 |
| JP | 6108051 B1 | 4/2017 |
| JP | 2017-224710 A | 12/2017 |

(Continued)

OTHER PUBLICATIONS

Murokawa, JP 2017224710 A (Year: 2017).*

(Continued)

*Primary Examiner* — Vy T Nguyen
(74) *Attorney, Agent, or Firm* — BURR PATENT LAW, PLLC

(57) ABSTRACT

A member for a semiconductor manufacturing apparatus includes a disk-shaped or annular ceramic heater, a metal base, an adhesive element bonding the metal base and the ceramic heater, an adhesive protective element disposed between the ceramic heater and the metal base to extend along a periphery of the adhesive element, and an anti-adhesion layer disposed between the adhesive element and the protective element, the anti-adhesion layer preventing adhesion between the adhesive element and the protective element.

13 Claims, 7 Drawing Sheets

(56) References Cited

FOREIGN PATENT DOCUMENTS

| JP | 2018-148162 | A  | 9/2018 |
|----|-------------|----|--------|
| JP | 2020-119997 | A1 | 8/2020 |
| JP | 2021-044302 | A  | 3/2021 |
| JP | 2021-044305 | A  | 3/2021 |

OTHER PUBLICATIONS

Korean Office Action (with English translation) dated Dec. 15, 2023 (Application No. 10-2022-0044870).
Japanese Office Action (Application No. 2021-097247) Jan. 9, 2024 (with English translation) (8 pages).
Chinese Office Action dated Oct. 13, 2024 (Application No. 202210262384.9).

* cited by examiner

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

A wafer processing apparatus is used to perform, for example, CVD or etching on a wafer by utilizing plasma. Patent Literature 1 discloses a wafer processing apparatus including a metal base constituted by a disk-shaped center-side metal base and an annular outer-peripheral-side metal base coupled to each other, a disk-shaped center-side electrostatic chuck heater disposed on an upper surface of the center-side metal base, and an annular outer-peripheral-side electrostatic chuck heater disposed on an upper surface of the outer-peripheral-side metal base. In the disclosed wafer processing apparatus, a disk-shaped wafer is electrostatically attracted to an upper surface of the center-side electrostatic chuck heater, and an annular focus ring is electrostatically attracted to an upper surface of the outer-peripheral-side electrostatic chuck heater. Furthermore, temperature of the wafer and temperature of the focus ring are individually controlled.

CITATION LIST

Patent Literature

PTL 1: JP2016-207979 A

SUMMARY OF THE INVENTION

The outer-peripheral-side metal base and the outer-peripheral-side electrostatic chuck heater are bonded to each other by using an adhesive sheet. The adhesive sheet may corrode in use environment. It is, therefore, conceived to prevent corrosion of the adhesive sheet by filling a protective element to extend along peripheries (an inner peripheral portion and an outer peripheral portion) of the adhesive sheet. Such a technique is not yet known to the public until now as far as the inventors recognize. However, when the protective element is filled to extend along the peripheries of the adhesive sheet, the adhesive sheet and the protective element are closely bonded into an integral form. When the outer-peripheral-side electrostatic chuck heater comes to high temperature in the above-mentioned state, the adhesive sheet and the protective element are caused to stretch in a radially outward direction. Here, in the case of the adhesive sheet having a greater CTE (coefficient of thermal expansion) than the protective element, a stretch amount of the adhesive sheet is greater than that of the protective element, and hence the protective element is pulled by the adhesive sheet at the inner peripheral portion of the adhesive sheet. As a result, peeling or cracking may occur in at least one of the adhesive sheet and the protective element in some cases. On the other hand, in the case of the adhesive sheet having a smaller CTE than the protective element, a stretch amount of the protective element is greater than that of the adhesive sheet, and hence the adhesive sheet is pulled by the protective element at the outer peripheral portion of the adhesive sheet. As a result, peeling or cracking may occur in at least one of the adhesive sheet and the protective element in some cases. Such a point is similarly applied to the adhesive sheet between the center-side metal base and the center-side electrostatic chuck heater. The above-described problem arises regardless of an electrostatic attraction function.

The present invention has been made to solve the above-described problem, and a main object of the present invention is to protect, by a protective element, an adhesive element bonding a ceramic heater and a metal base, while preventing the occurrence of trouble attributable to the difference in thermal expansion between the adhesive element and the protective element.

A first aspect of the present invention provides a member for a semiconductor manufacturing apparatus, the member comprising: a disk-shaped or annular ceramic heater; a metal base; an adhesive element bonding the metal base and the ceramic heater; an adhesive protective element disposed between the ceramic heater and the metal base to extend along a periphery of the adhesive element; and an anti-adhesion layer disposed between the adhesive element and the protective element, the anti-adhesion layer preventing adhesion between the adhesive element and the protective element.

The above-described member for the semiconductor manufacturing apparatus includes the adhesive protective element extending along the periphery of the adhesive element. The above-described member further includes, between the adhesive element and the protective element, the anti-adhesion layer preventing adhesion between the adhesive element and the protective element. Since the adhesive element is protected by the protective element, corrosion resistance of the adhesive element in use environment of the member for the semiconductor manufacturing apparatus is increased. Furthermore, regardless of whether the CTE of the adhesive element is greater or smaller than that of the protective element, either one of those components with the smaller CTE is hardly pulled by the other component with the greater CTE. Therefore, peeling or cracking can be prevented from occurring in the adhesive element and the protective element. It is hence possible to protect the adhesive element by the protective element, and further to prevent the occurrence of trouble attributable to the difference in thermal expansion between the adhesive element and the protective element.

In the member for the semiconductor manufacturing apparatus according to the first aspect of the present invention, the anti-adhesion layer may be a gap layer or a non-adhesive layer made of a material with no adhesive force. The gap layer serves to separate the adhesive element and the protective element. The non-adhesive layer made of the material with no adhesive force serves to inhibit or suppress one of the adhesive element and the protective element from pulling the other. Here, "the material with no adhesive force" includes not only a material with completely no adhesive force, but also a material with a weak adhesive force at such a level as not enabling one of the adhesive element and the protective element to pull the other (this point is similarly applied to the same expression in the following).

In the member for the semiconductor manufacturing apparatus according to the first aspect of the present invention, a chamfered portion may be formed at an edge of a surface of the ceramic heater, the surface facing the metal base, and the protective element may be disposed in a space surrounded by the chamfered portion and the metal base.

With the above-described features, an amount of the protective element used can be controlled to be kept substantially constant.

In the member for the semiconductor manufacturing apparatus according to the first aspect of the present invention, a circumferential protrusion may be provided on an inner side of an edge of a surface of the metal base, the surface facing the ceramic heater, and the protective element may be disposed in a space surrounded by the ceramic heater, the circumferential protrusion, and the metal base. With the above-described features, an amount of the protective element used can also be controlled to be kept substantially constant.

A second aspect of the present invention provides a member for a semiconductor manufacturing apparatus, the member comprising: a disk-shaped or annular ceramic heater; a metal base; an adhesive element bonding the metal base and the ceramic heater; and an adhesive protective element disposed between the ceramic heater and the metal base to extend along a periphery of the adhesive element, wherein the adhesive element includes a main portion, a narrow auxiliary portion disposed along a periphery of the main portion and bonded to the protective element, and an anti-adhesion portion disposed between the main portion and the auxiliary portion.

The above-described member for the semiconductor manufacturing apparatus includes the adhesive protective element extending along the periphery of the adhesive element. The adhesive element includes the main portion, the narrow auxiliary portion disposed along the periphery of the main portion and bonded to the protective element, and the anti-adhesion portion disposed between the main portion and the auxiliary portion. Since the adhesive element is protected by the protective element, corrosion resistance of the adhesive element in use environment of the member for the semiconductor manufacturing apparatus is increased. Furthermore, regardless of whether the CTE of the adhesive element is greater or smaller than that of the protective element, a force by which either one of those components with the smaller CTE is pulled by the other component with the greater CTE is a relatively small force acting between the narrow auxiliary portion of the adhesive element and the protective element. Therefore, peeling or cracking can be prevented from occurring in the adhesive element and the protective element. It is hence possible to protect the adhesive element by the protective element, and further to prevent the occurrence of trouble attributable to the difference in thermal expansion between the adhesive element and the protective element.

In the member for the semiconductor manufacturing apparatus according to the second aspect of the present invention, the anti-adhesion portion may be disposed intermittently or continuously along a circumference. This feature can also provide the above-mentioned advantageous effects.

In the member for the semiconductor manufacturing apparatus according to the second aspect of the present invention, the anti-adhesion portion may be a gap portion or a non-adhesive portion made of a material with no adhesive force. The gap portion serves to separate the main portion and the auxiliary portion of the adhesive element. The non-adhesive portion made of the material with no adhesive force serves to inhibit or suppress the main portion of the adhesive element from pulling the protective element or from being pulled by the protective element through the auxiliary portion.

In the member for the semiconductor manufacturing apparatus according to each of the first and second aspects of the present invention, the metal base may include an insulating film on a lateral surface of the metal base and on at least a region of a surface of the metal base where the protective element is formed, the surface facing the ceramic heater. This feature can prevent unexpected discharge from occurring through the metal base. The insulating film preferably has corrosion resistance under the use environment. The insulating film can be formed of, for example, a ceramic sprayed film. The insulating film may be formed to extend over a region of the surface of the metal base where the adhesive element is formed, that surface facing the ceramic heater.

In the member for the semiconductor manufacturing apparatus according to each of the first and second aspects of the present invention, the ceramic heater may be an annular member on which a focus ring is placed, the adhesive element may have an annular shape, and the protective element may be disposed on each of an inner peripheral side and an outer peripheral side of the adhesive element. Thus, a focus ring placement table may be used as the member for the semiconductor manufacturing apparatus. In the focus ring placement table, when the CTE of the adhesive element is smaller than that of the protective element, the anti-adhesion layer may be disposed at least between an outer peripheral portion of the adhesive element and the protective element disposed on an outer side of the outer peripheral portion. When the CTE of the adhesive element is greater than that of the protective element, the anti-adhesion layer may be disposed at least between an inner peripheral portion of the adhesive element and the protective element disposed on an inner side of the inner peripheral portion.

In the member for the semiconductor manufacturing apparatus according to each of the first and second aspects of the present invention, the ceramic heater may be a disk-shaped member on which a wafer is placed, the adhesive element may have a circular shape, and the protective element may be disposed on an outer peripheral side of the adhesive element. Thus, a wafer placement table may be used as the member for the semiconductor manufacturing apparatus. The features of the present invention may be applied to the wafer placement table, when the CTE of the adhesive element is smaller than that of the protective element.

DETAILED DESCRIPTION OF THE INVENTION

Figure 1:
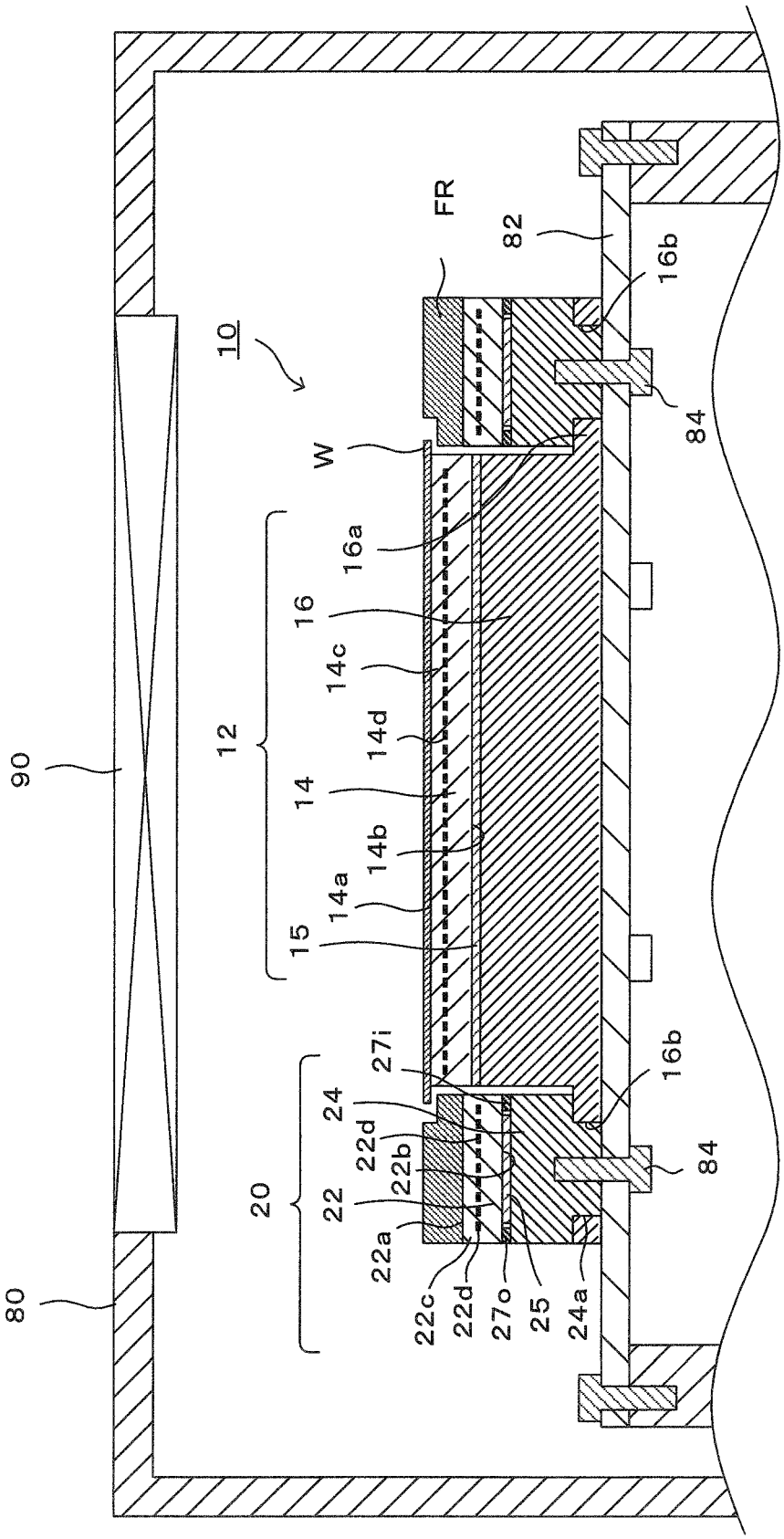
FIG. 1 is a vertical sectional view of a wafer processing apparatus 10.
Figure 2:
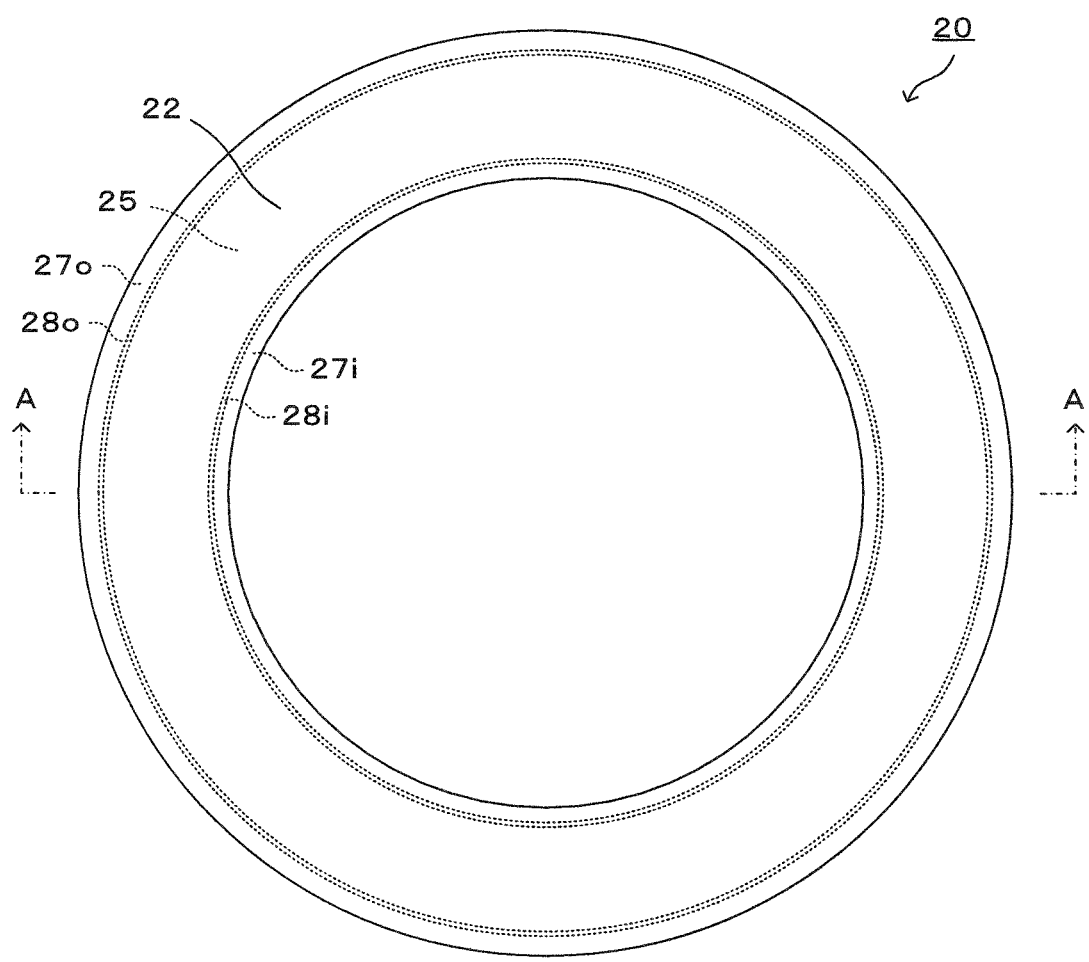
FIG. 2 is a plan view of a focus ring placement table 20.
Figure 3:
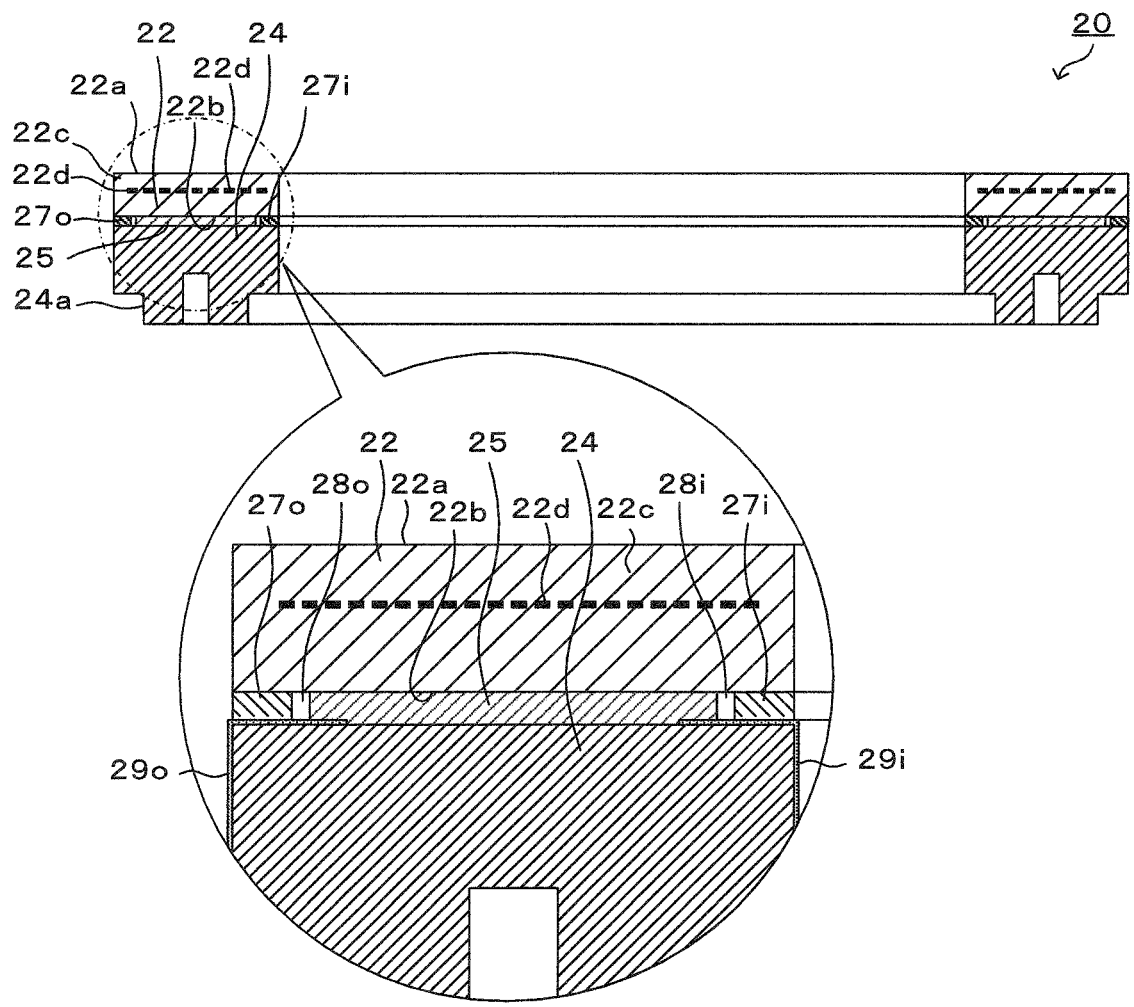
FIG. 3 is a vertical sectional view taken along A-A in FIG. 2.
Figure 4:
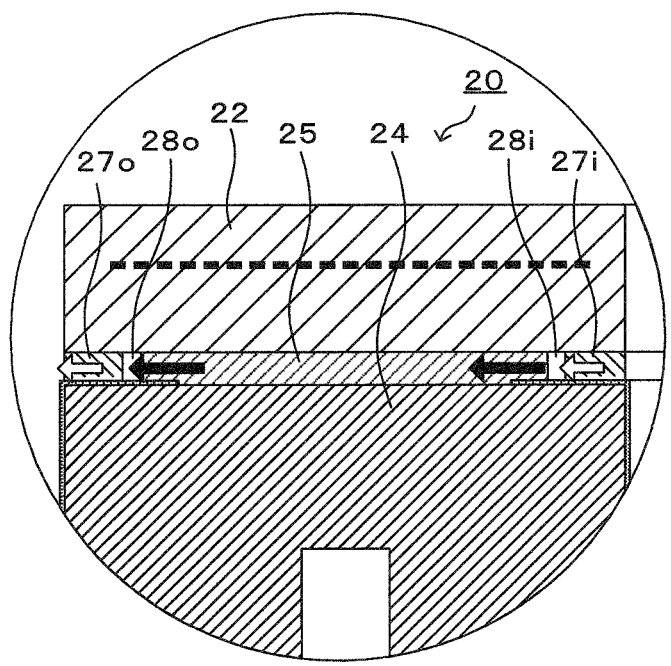
FIG. 4 is an explanatory view illustrating the case in which an adhesive sheet 25 has a greater CTE than inner- and outer-peripheral-side protective elements 27i and 27o.
Figure 5:
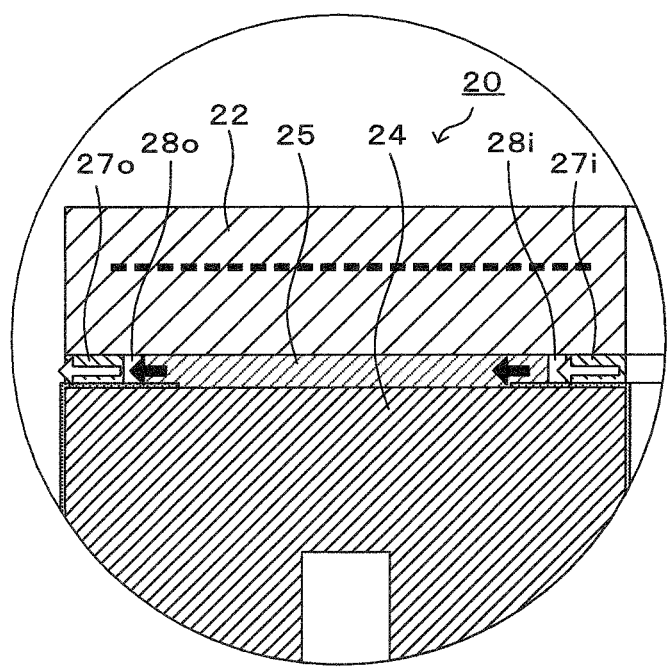
FIG. 5 is an explanatory view illustrating the case in which the adhesive sheet 25 has a smaller CTE than the inner- and outer-peripheral-side protective elements 27i and 27o.

A preferred embodiment of the present invention will be described below with reference to the drawings. FIG. 1 is a vertical sectional view of a wafer processing apparatus 10, FIG. 2 is a plan view of a focus ring placement table 20, and FIG. 3 is a sectional view taken along A-A in FIG. 2 (including an enlarged partial view). FIG. 4 is an explanatory view illustrating the case in which an adhesive sheet 25 has a greater CTE than inner- and outer-peripheral-side protective elements 27i and 27o, and FIG. 5 is an explanatory view illustrating the case in which the adhesive sheet 25 has a smaller CTE than the inner- and outer-peripheral-side the protective elements 27i and 27o. Although the following description is made using words "upper, lower, left, right, front, and rear", for example, in some cases, those words "upper, lower, left, right, front, and rear" merely indicate relative positional relations.

The wafer processing apparatus 10 is used to perform, for example, CVD or etching on a wafer W by utilizing plasma and is fixed to a mounting plate 82 that is disposed inside a chamber 80 for a semiconductor process. The wafer processing apparatus 10 includes a wafer placement table 12 and a focus ring placement table 20. Hereinafter, the focus ring is abbreviated to "FR" in some cases.

The wafer placement table 12 includes a wafer-heating ceramic heater 14 and a wafer cooling plate 16. The wafer cooling plate 16 is bonded to a rear surface 14b of the wafer-heating ceramic heater 14 on an opposite side to a front surface 14a thereof, the front surface 14a serving as a wafer placement surface, with an adhesive sheet 15 interposed between the wafer cooling plate 16 and the wafer-heating ceramic heater 14. The adhesive sheet 15 is a circular both-sided adhesive tape. For example, epoxy resin, acrylic resin, or silicone resin may be used as a material of the adhesive sheet 15.

The wafer-heating ceramic heater 14 is a disk-shaped member and is formed by embedding a resistance heating element 14d in a ceramic base 14c. The ceramic base 14c is a disk-shaped plate made of a ceramic material represented by, for example, alumina, aluminum nitride, or yttria. The wafer W is placed on the front surface 14a of the ceramic base 14c. The resistance heating element 14d is formed of a conductive coil or printed pattern and is wired over the entire front surface in a one-stroke pattern from one end to the other end without including intersections when viewed in plan. The one end and the other end of the resistance heating element 14d are connected to a pair of power feed rods (not illustrated), the power feed rods penetrating through the mounting plate 82, the wafer cooling plate 16, and the adhesive sheet 15 and being inserted into the ceramic base 14c. A voltage is applied to the resistance heating element 14d through the power feed rods.

The wafer cooling plate 16 is a disk-shaped plate made of metal represented by, for example, aluminum or an aluminum alloy and includes therein a coolant path (not illustrated) through which a coolant can be circulated. The coolant path is connected to a coolant supply path and a coolant discharge path (not illustrated) each penetrating through the mounting plate 82. A coolant discharged from the coolant discharge path is returned to the coolant supply path again after being subjected to temperature adjustment. The wafer cooling plate 16 includes a wafer-cooling-plate flange portion 16a protruding radially outward from an outer peripheral surface of a lower end portion of the wafer cooling plate 16 (namely, an end portion thereof on a side closer the mounting plate 82). A plurality of through-holes 16b are formed in the wafer-cooling-plate flange portion 16a along a circumferential direction.

The FR placement table 20 is separate from the wafer placement table 12 and is disposed around an outer periphery of the wafer placement table 12. The FR placement table 20 includes an FR heating ceramic heater 22 and an FR cooling plate 24. The FR cooling plate 24 is bonded to a rear surface 22b of the FR heating ceramic heater 22 on an opposite side to a front surface 22a thereof, the front surface 22a serving as an FR placement surface, with an adhesive sheet 25 interposed between the FR cooling plate 24 and the FR heating ceramic heater 22. The adhesive sheet 25 is an annular both-sided adhesive tape. For example, epoxy resin, acrylic resin, or silicone resin may be used as a material of the adhesive sheet 25.

The FR heating ceramic heater 22 is formed by embedding a resistance heating element 22d in a ceramic base 22c. The ceramic base 22c is a ring-shaped plate made of a similar material to that of the ceramic base 14c. A focus ring FR is placed on the front surface 22a of the ceramic base 22c. The resistance heating element 22d is formed of a conductive coil or printed pattern and is wired over the entire front surface in a one-stroke pattern from one end to the other end without including intersections when viewed in plan. The one end and the other end of the resistance heating element 22d are connected to a pair of power feed rods (not illustrated), the power feed rods penetrating through the mounting plate 82, the FR cooling plate 24, and the adhesive sheet 25 and being inserted into the ceramic base 22c. A voltage is applied to the resistance heating element 22d through the power feed rods.

The FR cooling plate 24 is a ring-shaped plate made of metal represented by, for example, aluminum or an aluminum alloy and includes therein a coolant path (not illustrated) through which a coolant can be circulated. The coolant path is connected to a coolant supply path and a coolant discharge path each penetrating through the mounting plate 82. A coolant discharged from the coolant discharge path is returned to the coolant supply path again after being subjected to temperature adjustment. The FR cooling plate 24 includes a plurality of protruding portions 24a provided at a rear surface of the FR cooling plate 24 along a circumferential direction. The wafer placement table 12 is fixed to the mounting plate 82 with the FR placement table 20 interposed therebetween by fastening bolts 84 into threaded holes of the protruding portions 24a from a rear surface side of the mounting plate 82 in such a state that the protruding portions 24a provided at the rear surface of the FR cooling plate 24 are fitted to the through-holes 16b of the wafer-cooling-plate flange portion 16a.

In a region between the FR heating ceramic heater 22 and the FR cooling plate 24, on an inner peripheral side of the adhesive sheet 25, an adhesive inner-peripheral-side protective element 27i is disposed to extend along an inner peripheral portion (inner peripheral surface) of the adhesive sheet 25. An inner-peripheral-side gap layer 28i serving as an anti-adhesion layer is disposed between the adhesive sheet 25 and the inner-peripheral-side protective element 27i. In the region between the FR heating ceramic heater 22 and the FR cooling plate 24, on an outer peripheral side of the adhesive sheet 25, an adhesive outer-peripheral-side protective element 27o is disposed to surround an outer peripheral portion (outer peripheral surface) of the adhesive sheet 25. An outer-peripheral-side gap layer 28o serving as an anti-adhesion layer is disposed between the adhesive sheet 25 and the outer-peripheral-side protective element 27o. The inner-peripheral-side protective element 27i and the outer-peripheral-side protective element 27o are each made of a material with higher corrosion resistance than the adhesive sheet 25 in an environmental atmosphere (for example, an atmosphere of process gas or plasma) under which the wafer processing apparatus 10 is used. Accordingly, the inner-peripheral-side protective element 27i and the outer-peripheral-side protective element 27o serve to protect the adhesive sheet 25 from the atmosphere of use environment. For example, when epoxy resin is used as the material of the adhesive sheet 25, silicone resin can be used as materials of the inner-peripheral-side protective element 27i and the outer-peripheral-side protective element 27o.

The FR cooling plate 24 includes an inner-peripheral-side insulating film 29i and an outer-peripheral-side insulating film 29o. The inner-peripheral-side insulating film 29i is disposed on an inner peripheral surface of the FR cooling plate 24 and a region of a surface of the FR cooling plate 24 on a side facing the FR heating ceramic heater 22 where the inner-peripheral-side protective element 27i is formed. In this embodiment, the inner-peripheral-side insulating film 29i extends up to an inner position of the adhesive sheet 25. The outer-peripheral-side insulating film 29o is disposed on an outer peripheral surface of the FR cooling plate 24 and a region of the surface of the FR cooling plate 24 on the side facing the FR heating ceramic heater 22 where the outer-peripheral-side protective element 27o is formed. In this embodiment, the outer-peripheral-side insulating film 29o extends up to an inner position of the adhesive sheet 25. The insulating films 29i and 29o preferably have corrosion resistance under the use environment. The insulating films 29i and 29o can be each formed of, for example, a sprayed film. An insulating ceramic (for example, alumina or yttria) may be used as a material of the sprayed film.

The FR placement table 20 can be manufactured by the following method, for example. First, the FR heating ceramic heater 22, the FR cooling plate 24, and a both-sided tape are prepared. The both-sided tape finally becomes the adhesive sheet 25 and includes release paper sheets on both surfaces. Then, one release paper sheet is released from one surface of the both-sided tape to make an adhesive surface exposed, and the exposed adhesive surface of the both-sided tape is bonded to a rear surface of the FR cooling plate 24. Then, the other release paper sheet is released from the other surface of the both-sided tape to make an adhesive surface exposed, and the rear surface 22b of the FR heating ceramic heater 22 is placed on and bonded to the exposed adhesive surface. This provides a state in which the FR heating ceramic heater 22 and the FR cooling plate 24 are bonded to each other by the adhesive sheet 25. Thereafter, an adhesive filling material is filled to regions along peripheries (on an inner peripheral side and an outer peripheral side) of the adhesive sheet 25 between the FR heating ceramic heater 22 and the FR cooling plate 24. The filling material finally becomes the inner- and outer-peripheral-side protective elements 27i and 27o. On that occasion, the filling material is filled such that a gap is left between the filling material and the adhesive sheet 25. Then, the filling material is solidified to form the inner- and outer-peripheral-side protective elements 27i and 27o. As a result, the FR placement table 20 is obtained.

An example of use of the wafer processing apparatus 10 will be described below with reference to FIG. 1. The chamber 80 includes therein the mounting plate 82 on which the wafer processing apparatus 10 is to be mounted. As described above, the wafer processing apparatus 10 is mounted on the mounting plate 82. A shower head 90 for discharging the process gas into the inside of the chamber 80 from many gas injection holes is disposed at a ceiling surface of the chamber 80.

The disk-shaped wafer W is placed on the front surface 14a of the wafer processing apparatus 10. Temperature of the wafer W can be controlled by adjusting both electric power supplied to the resistance heating element 14d of the wafer ceramic heater 14 and temperature of the coolant supplied to the coolant path (not illustrated) in the wafer cooling plate 16. Temperature control of the wafer W is performed by detecting the temperature of the wafer W with a temperature detection sensor (not illustrated) and executing feedback control such that the detected temperature is kept at a target temperature.

The focus ring (FR) is placed on the front surface 22a of the wafer processing apparatus 10. To avoid interference with the wafer W, the focus ring includes a step formed to be recessed along an inner periphery of an upper end portion. Temperature of the focus ring can be controlled by adjusting both electric power supplied to the resistance heating element 22d of the FR heating ceramic heater 22 and temperature of the coolant supplied to the coolant path (not illustrated) in the FR cooling plate 24. Temperature control of the focus ring is performed by detecting the temperature of the focus ring with a temperature detection sensor (not illustrated) and executing feedback control such that the detected temperature is kept at a target temperature.

In the above-mentioned state, the inside of the chamber 80 is set to be held in a predetermined vacuum atmosphere (or a reduced-pressure atmosphere), and plasma is generated by supplying high-frequency electric power between the wafer cooling plate 16 of the wafer placement table 12 and the shower head 90 while the process gas is supplied from the shower head 90. Then, CVD film deposition or etching is performed on the wafer by utilizing the produced plasma. A space below the mounting plate 82 is held in an atmosphere.

With the progress of plasma processing on the wafer W, the focus ring also wears. However, because the focus ring is thick, replacement of the focus ring is made after processing a plurality of wafers W.

Here, behaviors of the adhesive sheet 25 and the inner- and outer-peripheral-side protective elements 27i and 27o when the adhesive sheet 25 of the FR placement table 20 has a greater CTE than the inner- and outer-peripheral-side protective elements 27i and 27o are described with reference to FIG. 4. When the FR placement table 20 comes to high temperature, the adhesive sheet 25 and the inner- and outer-peripheral-side protective elements 27i and 27o are caused to stretch in a radially outward direction (direction denoted by arrows in FIG. 4). At that time, a stretch amount (denoted by a black arrow in FIG. 4) of the adhesive sheet 25 is greater than that (denoted by a white arrow in FIG. 4) of each of the inner- and outer-peripheral-side protective elements 27i and 27o. If the inner-peripheral-side protective element 27i and the adhesive sheet 25 are bonded to each other, the inner-peripheral-side protective element 27i is pulled by the adhesive sheet 25. Hence peeling or cracking may occur in at least one of the adhesive sheet 25 and the inner-peripheral-side protective element 27i in some cases. In this embodiment, however, the inner-peripheral-side gap layer 28i serving as the anti-adhesion layer is disposed between the inner-peripheral-side protective element 27i and the adhesive sheet 25. Accordingly, the inner-peripheral-side protective element 27i is avoided from being pully by the adhesive sheet 25, and the occurrence of peeling or cracking in the adhesive sheet 25 and the inner-peripheral-side protective element 27i can be prevented.

Behaviors of the adhesive sheet 25 and the inner- and outer-peripheral-side protective elements 27i and 27o when the adhesive sheet 25 of the FR placement table 20 has a smaller CTE than the inner- and outer-peripheral-side protective elements 27i and 27o are described with reference to FIG. 5. When the FR placement table 20 comes to high temperature, the adhesive sheet 25 and the inner- and outer-peripheral-side protective elements 27i and 27o are caused to stretch in the radially outward direction (direction denoted by arrows in FIG. 5). At that time, a stretch amount (denoted by a white arrow in FIG. 5) of each of the inner- and outer-peripheral-side protective elements 27i and 27o is greater than that (denoted by a black arrow in FIG. 5) of the adhesive sheet 25. If the outer-peripheral-side protective element 27o and the adhesive sheet 25 are bonded to each other, the adhesive sheet 25 is pulled by the outer-peripheral-side protective element 27o. Hence peeling or cracking may occur in at least one of the adhesive sheet 25 and the outer-peripheral-side protective element 27o in some cases. In this embodiment, however, the outer-peripheral-side gap layer 28o serving as the anti-adhesion layer is disposed between the outer-peripheral-side protective element 27o and the adhesive sheet 25. Accordingly, the adhesive sheet 25 is avoided from being pully by the outer-peripheral-side protective element 27o, and the occurrence of peeling or cracking in the adhesive sheet 25 and the outer-peripheral-side protective element 27o can be prevented.

The correspondence between components in this embodiment and components in the present invention is now explained. The FR placement table 20 in this embodiment corresponds to a member for a semiconductor manufacturing apparatus in the present invention. The FR heating ceramic heater 22 corresponds to a ceramic heater. The FR cooling plate 24 corresponds to a metal base. The adhesive sheet 25 corresponds to an adhesive element. The inner- and outer-peripheral-side protective elements 27i and 27o correspond to a protective element. The inner- and outer-peripheral-side gap layers 28i and 28o correspond to an anti-adhesion layer. The inner- and outer-peripheral-side insulating films 29i and 29o correspond to an insulating film.

According to the FR placement table 20 described above, since the adhesive sheet 25 is protected by the inner- and outer-peripheral-side protective elements 27i and 27o, the corrosion resistance of the adhesive sheet 25 in the use environment of the FR placement table 20 is increased. Furthermore, regardless of whether the CTE of the adhesive sheet 25 is greater or smaller than that of the inner- and outer-peripheral-side protective elements 27i and 27o, either one of those components with the smaller CTE is avoided from being pulled by the other component with the greater CTE. Therefore, peeling or cracking can be prevented from occurring in the adhesive sheet 25 and the inner- and outer-peripheral-side protective elements 27i and 27o. Thus, it is possible to protect the adhesive sheet 25 by the inner- and outer-peripheral-side protective elements 27i and 27o, and further to prevent the occurrence of trouble (for example, peeling or cracking) attributable to the difference in thermal expansion between the adhesive sheet 25 and the inner- and outer-peripheral-side protective elements 27i and 27o.

Moreover, the inner-peripheral-side gap layer 28i serves to separate the adhesive sheet 25 and the inner-peripheral-side protective element 27i, and the outer-peripheral-side gap layer 28o serves to separate the adhesive sheet 25 and the outer-peripheral-side protective element 27o.

In addition, since the FR cooling plate 24 includes the inner-peripheral-side insulating films 29i and outer-peripheral-side insulating films 29o on lateral surfaces of the FR cooling plate 24 and on the regions of the surface of the FR cooling plate 24 facing the FR heating ceramic heater 22 where the inner- and outer-peripheral-side protective elements 27i and 27o are formed, unexpected discharge can be prevented from occurring through the FR cooling plate 24.

It is needless to say that the present invention is in no way limited by the above-described embodiments and can be implemented in various forms insofar as not departing from the technical scope of the present invention.

Figure 6:
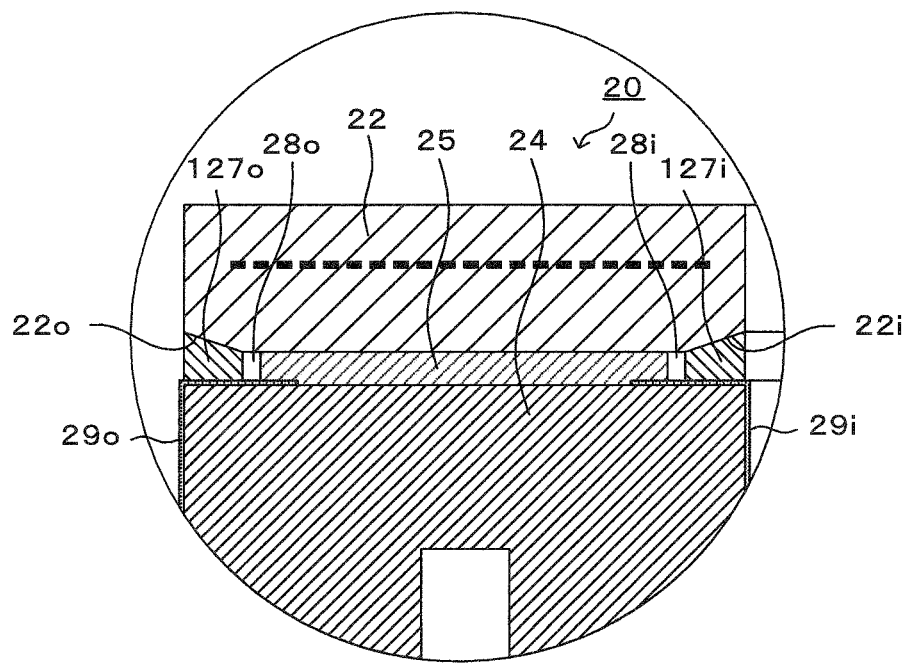
FIG. 6 is a sectional view of a modification of the focus ring placement table 20.

For example, as illustrated in FIG. 6, the above-described embodiment may further include inner- and outer-peripheral-side chamfered portions 22i and 22o that are formed respectively at inner- and outer-peripheral edges of the surface of the FR heating ceramic heater 22 facing the FR cooling plate 24. In FIG. 6, the same components as those in the above-described embodiment are denoted by the same reference signs. In this case, an inner-peripheral-side protective element 127i is disposed in a space surrounded by the inner-peripheral-side chamfered portion 22i and the FR cooling plate 24, and an outer-peripheral-side protective element 127o is disposed in a space surrounded by the outer-peripheral-side chamfered portion 22o and the FR cooling plate 24. Therefore, an amount of each of the protective elements 127i and 127o used (filled) can be controlled to be kept substantially constant. The chamfered portion 22i and 22o may be formed by C-chamfering or R-chamfering.

Figure 7:
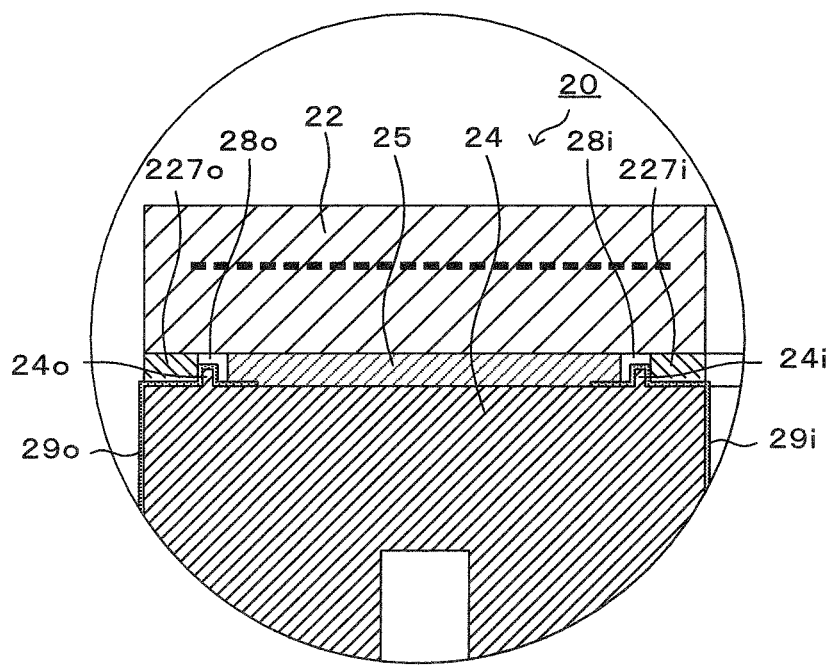
FIG. 7 is a sectional view of a modification of the focus ring placement table 20.

As illustrated in FIG. 7, the above-described embodiment may further include an inner-peripheral-side circumferential protrusion 24i near (on an inner side of) an inner peripheral edge of the surface of the FR cooling plate 24 facing the FR heating ceramic heater 22 and an outer-peripheral-side circumferential protrusion 24o near (on an inner side of) an outer peripheral edge thereof. The inner- and outer-peripheral-side circumferential protrusions 24i and 24o may be disposed concentrically with the FR heating ceramic heater 22. In FIG. 7, the same components as those in the above-described embodiment are denoted by the same reference signs. In this case, an inner-peripheral-side protective element 227i is disposed in a space surrounded by the FR heating ceramic heater 22, the inner-peripheral-side circumferential protrusion 24i, and the FR cooling plate 24, while an outer-peripheral-side protective element 227o is disposed in a space surrounded by the FR heating ceramic heater 22, the outer-peripheral-side circumferential protrusion 24o, and the FR cooling plate 24. Therefore, an amount of each of the protective elements 227i and 227o used (filled) can be controlled to be substantially constant.

Figure 8:
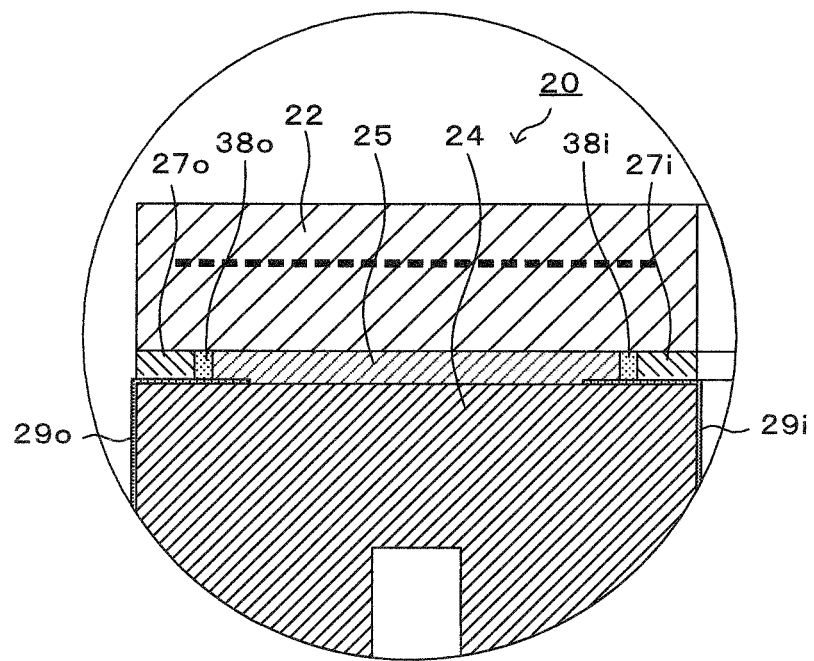
FIG. 8 is a sectional view of a modification of the focus ring placement table 20.

In the above-described embodiment, the inner- and outer-peripheral-side gap layers 28i and 28o are disposed as the anti-adhesion layers. As illustrated in FIG. 8, however, inner- and outer-peripheral-side non-adhesive layers 38i and 38o may be formed by filling a non-adhesive material (for example, powder of ceramic such as alumina or yttria, or a silicone-based release agent) into the inner- and outer-peripheral-side gap layers 28i and 28o. In FIG. 8, the same components as those in the above-described embodiment are denoted by the same reference signs. In this case, it is also possible to inhibit or suppress one of the adhesive sheet 25 and the inner-peripheral-side protective element 27i from pulling the other, and to inhibit or suppress one of the adhesive sheet 25 and the outer-peripheral-side protective element 27o from pulling the other.

Figure 9:
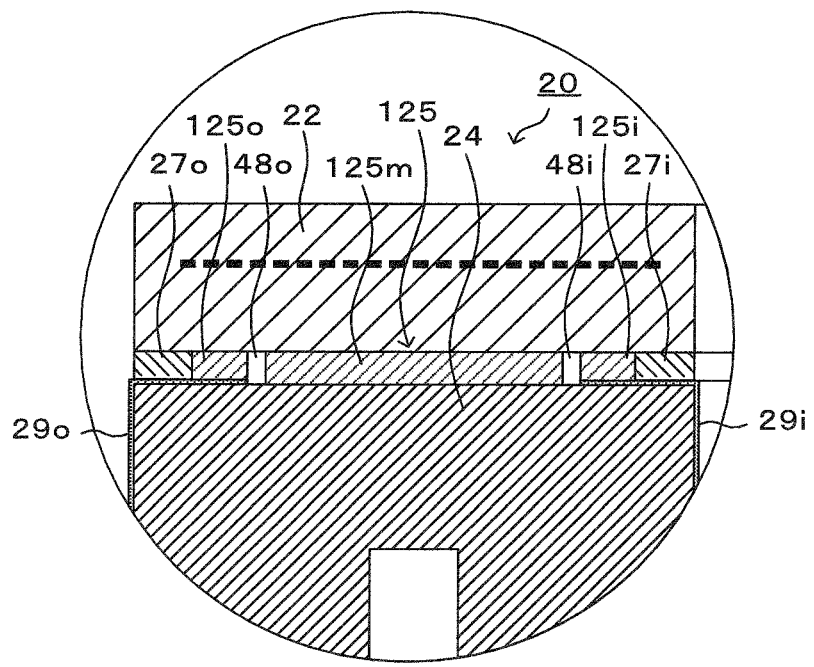
FIG. 9 is a sectional view of a modification of the focus ring placement table 20.

In the above-described embodiment, the inner-peripheral-side gap layer 28i is disposed between the adhesive sheet 25 and the inner-peripheral-side protective element 27i, and the outer-peripheral-side gap layer 28o is disposed between the adhesive sheet 25 and the outer-peripheral-side protective element 27o. However, a configuration illustrated in FIG. 9 may be adopted instead. In FIG. 9, the same components as those in the above-described embodiment are denoted by the same reference signs. In this case, an adhesive sheet 125 includes an annular main portion 125m with a wide width, an annular inner-peripheral-side auxiliary portion 125i with a narrow width which is disposed along an inner periphery of the main portion 125m, and an annular outer-peripheral-side auxiliary portion 125o with a narrow width which is disposed along an outer periphery of the main portion 125m. The inner-peripheral-side auxiliary portion 125i is bonded to the inner-peripheral-side protective element 27i while an inner-peripheral-side gap portion 48i serving as an anti-adhesion portion is disposed between the inner-peripheral-side auxiliary portion 125i and the main portion 125m. The outer-peripheral-side auxiliary portion 125o is bonded to the outer-peripheral-side protective element 27o while an outer-peripheral-side gap portion 48o serving as an anti-adhesion portion is disposed between the outer-peripheral-side auxiliary portion 125o and the main portion 125m. Since the adhesive sheet 125 is protected by the inner- and outer-peripheral-side protective elements 27i and 27o, the corrosion resistance of the adhesive sheet 125 in the use environment of the FR placement table 20 is increased. Furthermore, regardless of whether the CTE of the adhesive sheet 125 is greater or smaller than that of the inner- and outer-peripheral-side protective elements 27i and 27o, a force by which either one of those components with the smaller CTE is pulled by the other component with the greater CTE is a relatively small force acting between the narrow inner-peripheral-side auxiliary portion 125i of the adhesive sheet 125 and the inner-peripheral-side protective element 27i or between the narrow outer-peripheral-side auxiliary portion 125o of the adhesive sheet 125 and the outer-peripheral-side protective element 27o. Therefore, peeling or cracking can be prevented from occurring in the adhesive sheet 125 and the inner- and outer-peripheral-side protective elements 27i and 27o.

Although the inner- and outer-peripheral-side gap portions 48i and 48o may be disposed continuously along the circumference as illustrated in FIG. 9, they may be formed intermittently. For example, the inner-peripheral-side gap portion 48i may be formed intermittently along the circumference by providing a plurality of bridging portions to radially extend from a center of the annular main portion 125m, the bridging portions bridging between the main portion 125m and the inner-peripheral-side auxiliary portion 125i in a radial direction. The above point is similarly applied to the outer-peripheral-side gap portion 48o. In addition, the inner- and outer-peripheral-side gap portions 48i and 48o may be formed as inner- and outer-peripheral-side non-adhesive portions by filling a material with no adhesive force (for example, powder of ceramic such as alumina or yttria) into those gap portions.

In the FR placement table 20 according to the above-described embodiment, when the CTE of the adhesive sheet 25 is smaller than that of the inner- and outer-peripheral-side protective elements 27i and 27o, only the outer-peripheral-side gap layer 28o may be disposed. Thus, an inner peripheral portion of the adhesive sheet 25 and the inner-peripheral-side protective element 27i may be bonded to each other without disposing the inner-peripheral-side gap layer 28i. In this case, at high temperature, an amount by which the inner-peripheral-side protective element 27i stretches in the radially outward direction is greater than an amount by which the adhesive sheet 25 stretches, and hence the adhesive sheet 25 is compressed by the inner-peripheral-side protective element 27i. However, even when such compressive stress is generated, it does not substantially cause a problem. When the CTE of the adhesive sheet 25 is greater than that of the inner- and outer-peripheral-side protective elements 27i and 27o, only the inner-peripheral-side gap layer 28i may be disposed. Thus, an outer peripheral portion of the adhesive sheet 25 and the outer-peripheral-side protective element 27o may be bonded to each other without disposing the outer-peripheral-side gap layer 28o. In this case, at high temperature, an amount by which the adhesive sheet 25 stretches in the radially outward direction is greater than an amount by which the outer-peripheral-side protective element 27o stretches, and hence the outer-peripheral-side protective element 27o is compressed by the adhesive sheet 25. However, even when such compressive stress is generated, it does not substantially cause a problem.

Figure 10:
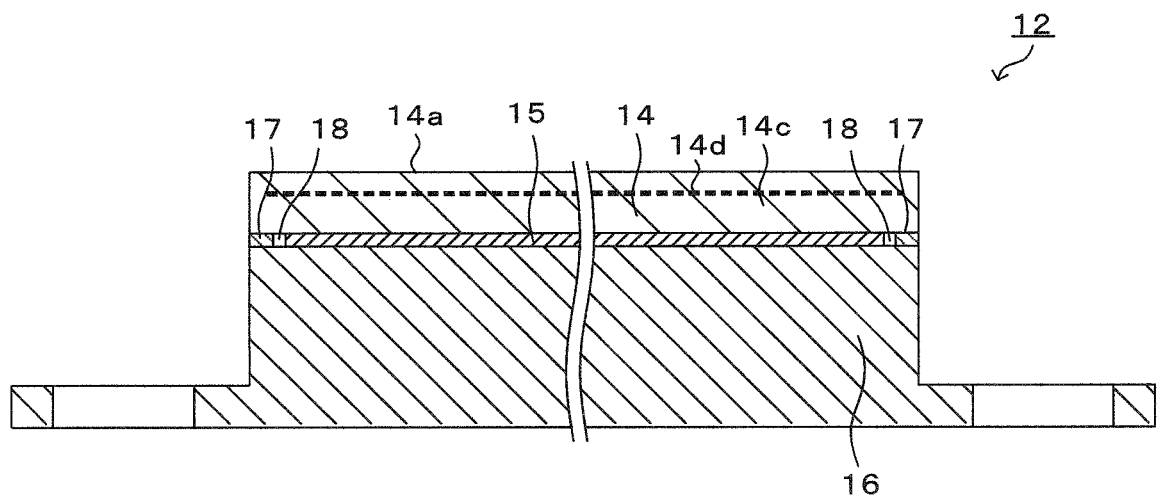
FIG. 10 is a sectional view of a modification of the wafer placement table 12.

Although the present invention is applied to the FR placement table 20 in the above-described embodiment, the present invention may also be applied to the wafer placement table 12. For example, the wafer placement table 12 may be constituted as illustrated in FIG. 10. In FIG. 10, the same components as those in the above-described embodiment are denoted by the same reference signs. The disk-shaped wafer-heating ceramic heater 14 and the disk-shaped (hat-shaped) wafer cooling plate 16 are bonded to each other by using the circular adhesive sheet 15. An annular adhesive protective element 17 is disposed between the wafer ceramic heater 14 and the wafer cooling plate 16 to surround a periphery (outer peripheral portion) of the adhesive sheet 15. A gap layer 18 serving as an anti-adhesion layer is disposed between the adhesive sheet 15 and the protective element 17, thereby preventing adhesion between the adhesive sheet 15 and the protective element 17. Since the adhesive sheet 15 is protected by the protective element 17, the corrosion resistance of the adhesive sheet 15 in the use environment of the wafer placement table 12 is increased. Furthermore, regardless of whether the CTE of the adhesive sheet 15 is greater or smaller than that of the protective element 17, either one of those components with the smaller CTE is avoided from being pulled by the other component with the greater CTE. Therefore, peeling or cracking can be prevented from occurring in the adhesive sheet 15 and the protective element 17. With the configuration of FIG. 10, it is possible to protect the adhesive sheet 15 by the protective element 17, and further to prevent the occurrence of trouble attributable to the difference in thermal expansion between the adhesive sheet 15 and the protective element 17. Note that, in the wafer placement table 12, the gap layer 18 may be formed when the CTE of the adhesive sheet 15 is smaller than that of the protective element 17.

In the wafer placement table 12 illustrated in FIG. 10, as in the case of FIG. 6, a chamfered portion may be formed at an outer-peripheral edge of the surface of the wafer ceramic heater 14 facing the wafer cooling plate 16, and the protective element 17 may be disposed in a space surrounded by the chamfered portion and the wafer cooling plate 16. Alternatively, as in the case of FIG. 7, a circumferential protrusion may be formed near the outer-peripheral edge (on an inner side) of the surface of the wafer ceramic heater 14 facing the wafer cooling plate 16, and the protective element 17 may be disposed in a space surrounded by the wafer-heating ceramic heater 14, the circumferential protrusion, and the wafer cooling plate 16. With the configurations described above, an amount of the protective element 17 used can be controlled to be kept substantially constant.

In the wafer placement table 12 illustrated in FIG. 10, as in the case of FIG. 8, a material with no adhesive force (for example, powder of ceramic such as alumina or yttria) may be filled into the gap layer 18 to form a non-adhesive layer.

In the wafer placement table 12 illustrated in FIG. 10, as in the case of FIG. 9, the adhesive sheet 15 may include a circular main portion and a narrow auxiliary portion disposed along an outer periphery of the main portion. Furthermore, the auxiliary portion may be bonded to the protective element 17 while a gap portion serving as an anti-adhesion portion may be disposed between the auxiliary portion and the main portion. In this case, since the adhesive sheet 15 is protected by the protective element 17, the corrosion resistance of the adhesive sheet 15 in the use environment of the wafer placement table 12 is increased. Moreover, regardless of whether the CTE of the adhesive sheet 15 is greater or smaller than that of the protective element 17, a force by which either one of those components with the smaller CTE is pulled by the other component with the greater CTE is a relatively small force acting between the narrow auxiliary portion of the adhesive sheet 15 and the protective element 17. Therefore, peeling or cracking can be prevented from occurring in the adhesive sheet 15 and the protective element 17.

In the above-described embodiment, an electrostatic electrode may be disposed in the wafer-heating ceramic heater 14 between the front surface 14a and the resistance heating element 14d, and the wafer W may be attracted to the front surface 14a by applying a direct-current voltage to the electrostatic electrode. An electrostatic electrode may be disposed in the FR heating ceramic heater 22 between the front surface 22a and the resistance heating element 22d, and the focus ring may be attracted to the front surface 22a by applying a direct-current voltage to the electrostatic electrode.

In the above-described embodiment, if the inner- and outer-peripheral-side protective elements 27i and 27o have deteriorated, new inner- and outer-peripheral-side protective elements 27i and 27o may be formed by removing the old protective elements and then filling the adhesive filling material in place. In removing the inner- and outer-peripheral-side protective elements 27i and 27o that have deteriorated, since those protective elements 27i and 27o are not bonded to the adhesive sheet 25, they can be relatively easily removed. This point is similarly applied to the cases of FIGS. 6 to 8.

Although, in the above-described embodiment, the wafer cooling plate 16 and the FR cooling plate 24 are separate members, the wafer cooling plate 16 and the FR cooling plate 24 may be integrated into one member.

Although, in the above-described embodiment, the adhesive sheet 25 is used, by way of example, as the adhesive element, another suitable element obtained by solidifying flowable resin may be used instead of the adhesive sheet 25.

The present application claims priority from Japanese Patent Application No. 2021-097247, filed on Jun. 10, 2021, the entire contents of which are incorporated herein by reference.

What is claimed is:

1. A member for a semiconductor manufacturing apparatus, the member comprising:
   a disk-shaped or annular ceramic heater including a top surface and a bottom surface;
   a metal base including a top surface and a bottom surface;
   an adhesive element bonding the top surface of the metal base and the bottom surface of the disk-shaped or annular ceramic heater;
   an adhesive protective element disposed between and in direct contact with the bottom surface of the disk-shaped or annular ceramic heater and the top surface of the metal base to extend along a periphery of the adhesive element; and
   an anti-adhesion layer disposed between the adhesive element and the protective element, the anti-adhesion layer preventing adhesion between the adhesive element and the protective element; and
   wherein the anti-adhesion layer is disposed between the bottom surface of the disk-shaped or annular ceramic heater and the top surface of the metal base.

2. The member for the semiconductor manufacturing apparatus according to claim 1,
   wherein the anti-adhesion layer is a gap layer or a non-adhesive layer made of a material with no adhesive force.

3. The member for the semiconductor manufacturing apparatus according to claim 1,
   wherein a chamfered portion is formed at an edge of a surface of the disk-shaped or annular ceramic heater, the surface facing the metal base, and the protective element is disposed in a space surrounded by the chamfered portion and the metal base.

4. The member for the semiconductor manufacturing apparatus according to claim 1,
   wherein a circumferential protrusion is provided on an inner side of an edge of a surface of the metal base, the surface facing the disk-shaped or annular ceramic heater, and the protective element is disposed in a space surrounded by the disk-shaped or annular ceramic heater, the circumferential protrusion, and the metal base.

5. The member for the semiconductor manufacturing apparatus according to claim 1,
   wherein the metal base includes an insulating film on a lateral surface of the metal base and on at least a region of a surface of the metal base where the protective element is formed, the surface facing the disk-shaped or annular ceramic heater.

6. The member for the semiconductor manufacturing apparatus according to claim 1,
   wherein the disk-shaped or annular ceramic heater is an annular member on which a focus ring is placed,
   the adhesive element has an annular shape, and
   the protective element is disposed on each of an inner peripheral side and an outer peripheral side of the adhesive element.

7. The member for the semiconductor manufacturing apparatus according to claim 1,
   wherein the disk-shaped or annular ceramic heater is a disk-shaped member on which a wafer is placed,
   the adhesive element has a circular shape, and
   the protective element is disposed on an outer peripheral side of the adhesive element.

8. A member for the semiconductor manufacturing apparatus, the member comprising:
   a disk-shaped or annular ceramic heater including a top surface and a bottom surface;

a metal base including a top surface and a bottom surface;

an adhesive element bonding the top surface of the metal base and the bottom surface of the disk-shaped or annular ceramic heater; and an adhesive protective element disposed between the disk-shaped or annular ceramic heater and the metal base to extend along a periphery of the adhesive element, wherein the adhesive element includes a main portion, an auxiliary portion that is narrower than the main portion, wherein the auxiliary portion is disposed along a periphery of the main portion and bonded to the protective element, and an anti-adhesion portion disposed between the main portion and the auxiliary portion; and wherein the anti-adhesion portion is disposed between the bottom surface of the disk-shaped or annular ceramic heater and the top surface of the metal base.

9. The member for the semiconductor manufacturing apparatus according to claim 8, wherein the anti-adhesion portion is disposed intermittently or continuously along a circumference.

10. The member for the semiconductor manufacturing apparatus according to claim 8, wherein the anti-adhesion portion is a gap portion or a non-adhesive portion made of a material with no adhesive force.

11. The member for the semiconductor manufacturing apparatus according to claim 8, wherein the metal base includes an insulating film on a lateral surface of the metal base and on at least a region of a surface of the metal base where the protective element is formed, the surface facing the disk-shaped or annular ceramic heater.

12. The member for the semiconductor manufacturing apparatus according to claim 8, wherein the disk-shaped or annular ceramic heater is an annular member on which a focus ring is placed, the adhesive element has an annular shape, and the protective element is disposed on each of an inner peripheral side and an outer peripheral side of the adhesive element.

13. The member for the semiconductor manufacturing apparatus according to claim 8, wherein the disk-shaped or annular ceramic heater is a disk-shaped member on which a wafer is placed, the adhesive element has a circular shape, and the protective element is disposed on an outer peripheral side of the adhesive element.

* * * * *